Sept. 17, 1968 R. E. SCHERRER 3,402,110

MASK ELECTROFORMING PROCESS

Filed Jan. 17, 1966

INVENTOR.
Raymond E. Scherrer
BY Francis W. Crotty
Attorney 3,402,110
Patented Sept. 17, 1968

1

3,402,110
MASK ELECTROFORMING PROCESS

Raymond E. Scherrer, Des Plaines, Ill., assignor to Zenith Radio Corporation, Chicago, Ill., a corporation of Delaware Filed Jan. 17, 1966, Ser. No. 521,188
4 Claims. (Cl. 204—11)

The present invention is directed to a method for making a mask that may be used in fabricating thin-film microcircuitry.

In the art of microcircuitry, it is well known that passive components may be formed by deposits of suitable layers upon a substrate. For example, an area of a particular dimension, coated to a certain depth with a conductive material, may represent a resistor of known value. In similar fashion, superposed layers of conductive material serving as electrodes and separated from one another by an intervening layer of dielectric constitute a capacitor. These components may be formed through cathode sputtering, evaporation, silk screening and other known techniques where the area for the deposit is defined by a mask which is apertured to correspond to the segments of the substrate intended to be coated. It has been determined that thin-film transistors may also be formed on a substrate in much the same fashion and the present invention has to do with the structure of a mask that may be used in forming passive components, active components or combinations thereof on a substrate to fabricate a microcircuit.

It is well known that filming a microcircuit usually requires several processing steps in each of which selected segments of the substrate receive a deposit or coating. As a general rule, the mask employed in one step is related to but specifically different from the masks employed in the other processing steps necessary to complete filming a microcircuit. The mask structure to be described is attractive in that it is conveniently mechanically rigid and self-supporting and also has indexing provisions which facilitate the necessary physical presentation of mask to substrate in forming the microcircuit.

It is a specific object of this invention to provide a novel method of making a mask to be used in forming microcircuit structures.

It is another specific object of the invention to provide such a mask characterized by having a self-supporting frame formed integrally therewith in an additive process.

It is still a further object of the invention to provide a method of constructing such a mask which lends itself to microcircuit fabrication even though the circuitry may include passive as well as active components.

The method of the invention for making a mask to be used in fabricating thin-film microcircuitry comprises applying over selected areas of a substrate a first coating to define a negative of a circuit pattern and to shield the coated areas against metallic deposition. A metallic film is deposited over the uncoated surface of the substrate, the film having a selected thickness and being continuous over the substrate except for the coated areas thereof. A second coating is thereafter applied over the metallic film, except for its marginal portions, to shield against further metallic deposition and the deposition is then continued on those marginal portions of the film to develop a frame enclosing the circuit pattern and of sufficient thickness to be self-supporting. Finally, the film with its frame is separated from its substrate.

2

The features of the present invention which are believed to be novel are set forth with particularity in the appended claims. The invention, together with further objects and advantages thereof, may best be understood by reference to the following description taken in connection with the accompanying drawing, in the several figures of which like reference numerals identify like elements, and in which:

Figure 1:
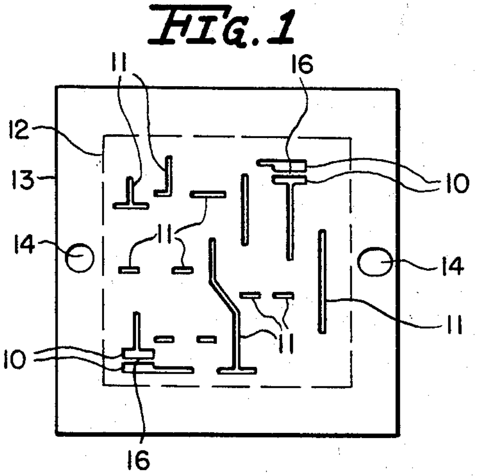
FIGURES 1, 3 and 4 are photographs used in the formation of a thin-film mask.

In describing a specific embodiment of the invention, particular reference will be made to the first of the series of masks that would be employed in filming a microcircuit which includes passive components and thin-film transistors. The first such mask is to provide for the electrodes of the thin-film transistors and connectors for making circuit connections between components of the microcircuit. The physical layout of these parts, including their dimensions and relative positions, is prepared in the usual "art" procedure. The layout is photographed to serve as a master in the exposure step of the mask fabrication. One such layout is shown in FIGURE 1 in which numeral 10 represents the position and dimension of the thin-film transistor electrodes. The lines 11 designate connectors that will interconnect components of the microcircuit under fabrication. For convenience, the broken-line rectangle 12 defines the area of the circuit pattern that is to be filmed and the larger rectangle 13, in conjunction with rectangle 12, defines a border where the frame of the mask is to be established. Within the frame area are a pair of registration or index holes 14. It will be assumed that areas 10, 11 and 14 of the photograph are transparent to ultraviolet but that the remainder of the photograph is opaque.

Figure 2:
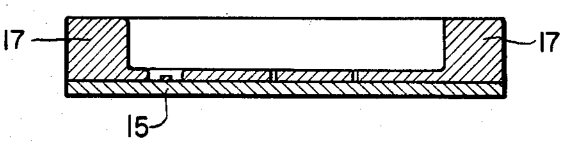
FIGURE 2 is a cross sectional view of such a mask.

The method of the invention for making the mask that is to be used in fabricating a thin film microcircuit includes applying over selected areas of a substrate a first coating to define a negative of a circuit pattern and to shield the coated areas against metallic deposition, that is to say, to arrange that the coated areas do not acquire a metallic film that is to be described presently in forming the mask. To accomplish this step, it will be assumed for convenience that the substrate 15 of FIGURE 2 has the same length and width dimensions as the photograph of FIGURE 1. The substrate may be any material in respect of which an electro-forming process may be carried out while permitting removal of the formed film from the substrate without destruction or damage to the film. Experiments to date indicate that highly polished Swedish blue steel is suitable for use as a substrate. This stress-relieved steel substrate as employed heretofore has a representative thickness of 20 mils.

To establish the circuit pattern on the substrate, the substrate is first coated over its upper surface with a negative photosensitive resist to a representative depth of one-half mil. A negative photosensitive resist is one in which the solubility of the resist is destroyed by the influence of impinging actinic light. In the case under consideration, any portion of the resist which is exposed to ultraviolet becomes insoluble in the solvent for the unexposed resist. The resist that has been employed in practicing the invention is identified as KPR. Coating of the substrate may easily be accomplished by hand dipping the substrate in a full strength solution of the resist.

Having coated the substrate, it is then exposed through the photograph of FIGURE 1 which, because of its opaque and transparent areas, results in exposing portions of the substrate which correspond precisely to the elements 10, 11 and 14 of the photograph. After this exposure, the circuit pattern is developed by washing the substrate with a solvent for the resist.

As a consequence, a negative of the circuit pattern of the photographic print is developed on substrate 15 in the form of areas of coating and these areas shield the portions of the substrate which they overlie against metallic deposition or against the electro-forming process employed in developing the microcircuit mask.

A convenient process of electro-forming employs a bath with nickel serving as the anode and the coated substrate serving as the cathode. The plating accomplished in the bath deposits a film of nickel on the exposed surface of the substrate and in one embodiment of the invention the filming took place with a plating current of 250 milliamperes for a processing time of one hour. This establishes the deposition of a metallic film of a particular thickness, namely one half mil, over the substrate and that film is, of course, continuous except for the areas of the substrate that were coated as a consequence of the exposure and development of the exposed resist as explained. At this juncture, the substrate is removed from the bath for the reason that in forming the particular mask under consideration it is desirable that the area 16 between the portions of the circuit negative which represent electrodes of the thin-film transistor have a thickness of only one-half mil. It is desirable to confine the thickness of this portion of the mask to the end that in the subsequent filming of the thin-film transistor in the use of this mask there will be a minimization of shadow effect because of the reduced thickness of the mask in the areas 16.

Figure 3:
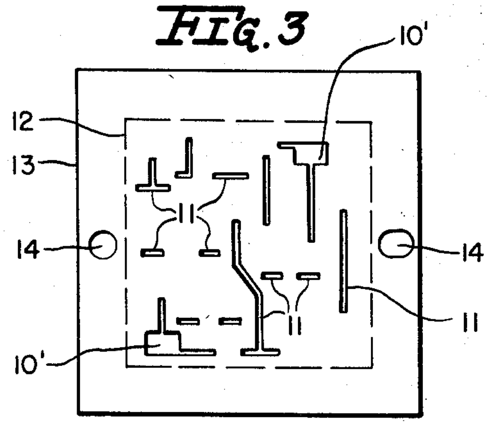

The metallic film in this step of the process has a uniform thickness over the substrate and, before the deposition is continued, the substrate with the mask in process is again coated with the same photosensitive resist and is exposed once more. For this exposure, however, there is a second photographic pattern employed differing from the first in that, as shown in FIGURE 3, there is a portion 10' which covers the area which in the previous photographic print was devoted to portions 10 and 16. After this exposure, the exposed coated surface is developed and provides a pattern essentially the same as that of FIGURE 1 except that there is a coating corresponding to the area 10' which serves to prevent any further deposition on the part of the mask that is interposed between the apertures provided for filming the electrodes of the thin-film transistor. The substrate is once again returned to the plating bath to build up the metallic film on the exposed surfaces of the substrate to a depth of approximately 5 mils. So far as constructing the mask with the necessary circuit configuration, the process is now complete but the invention contemplates that the mask formation continue through additional steps in order to provide a frame for the mask. Accordingly, the substrate is removed from the bath and once again coated with the photosensitive resist.

Figure 4:
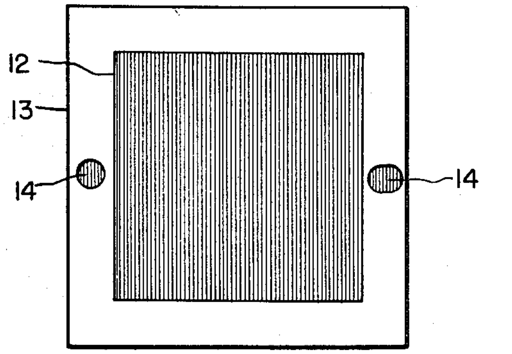

In exposing the substrate at this point, a photograph is employed which causes the exposed portion of the mask in process to correspond with the shaded area of FIGURE 4. It will be seen that the border area which circumscribes the pattern of the microcircuit includes portions 14 devoted to registration apertures. Exposure of the substrate through such a photograph and development of the exposed substrate results in confining this final coating of the resist to these areas which are devoted to the circuit pattern and to the index holes. In other words, only the marginal portion of the mask in process, which is to serve as a supporting frame, is now exposed.

The substrate is once again inserted into the plating bath and the deposition continued to develop a heavy frame 17 (FIGURE 2) having a thickness of 100 mils or more. This frame, of course, has registration holes 14 and, as indicated on the drawing, they may have specifically different contours in order that registration pins of similar contour may preclude inserting the framed mask into thin-filming apparatus in any other than its desired orientation.

After the frame 17 shall have been formed, the resultant mask with its frame is separated from the substrate. It is necessary to separate these parts without destroying in any way the mask and the circuit configuration that it represents. For the substrate that has been assumed, namely, one formed of Swedish blue steel, the separation is easily accomplished by a phosphoric acid bath of 50 percent solution. The substrate readily dissolves in such a bath and there are no adverse effects on the nickel mask.

Figure 5:
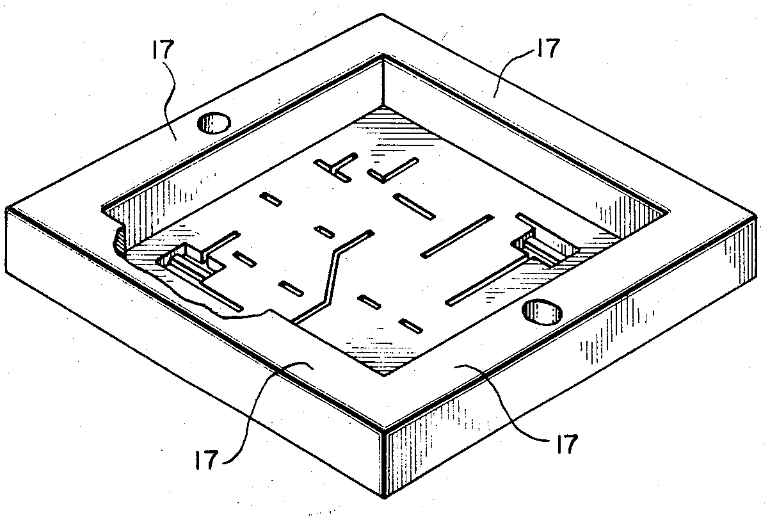
FIGURE 5 shows the mask in perspective.

Having separated the mask from the substrate, the mask forming process is complete and the resulting mask, shown in FIGURE 5, has a desired circuit representation and is also bordered by a self-supporting frame. The portions of the mask that are interposed between apertures 10 through which electrodes of thin-film transistors are to be filmed have a controlled thickness which minimizes shadow effects whereas the mask areas which surround apertures devoted to passive components or connectors are of much heavier weight and have adequate mechanical strength to permit their use in thin filming. The incorporation of a self-supporting frame with such a mask is most attractive and the provisions for indexing or registration are also highly beneficial.

The foregoing description has been simplified by assuming in the various illustrations that the mask includes but a single network or microcircuit pattern. Obviously, there may be two or more such patterns formed during the preparation of a mask. Where several patterns are formed in a single mask structure, whether they be identical to one another or not, it is desirable that the various patterns be separated from one another by sections of the frame which would be formed in the same manner and concurrently with the forming of frame 17 as described above.

While a particular embodiment of the invention has been shown and described, it will be obvious to those skilled in the art that changes and modifications may be made without departing from the invention in its broader aspects, and, therefore, the aim in the appended claims is to cover all such changes and modifications as fall within the true spirit and scope of the invention.

I claim:

1. The method of making a mask for use in fabricating thin-film microcircuitry which comprises the following steps:

applying over selected areas of a substrate a first coating to define a negative of a circuit pattern and to shield said coated areas against metallic electrodeposition;

electrodepositing over the uncoated surface of said substrate a metallic film of a predetermined thickness which is continuous over said substrate except for the coated areas thereof;

applying over said metallic film, except for the marginal portions thereof, a second coating to shield against further metallic electrodeposition;

continuing the metallic electrodeposition on said marginal portions of said film to develop a frame enclosing said circuit pattern and of sufficient thickness to be self supporting;

and separating said film with its frame from said substrate.

2. The method in accordance with claim 1 in which a plurality of areas of said substrate, included within the portion thereof underlying said frame, are coated and remain coated throughout all of said depositions to provide index apertures for said mask.

3. The method in accordance with claim 1 in which the deposition on said marginal portions is continued to develop a frame which is at least an order of magnitude thicker than said metallic film.

4. The method in accordance with claim 1 in which all of the uncoated surface of said substrate is filmed to develop a metallic film of uniform thickness after the application of said first coating and selected portions of said film are increased to a greater thickness before the application of said second coating.

References Cited

UNITED STATES PATENTS

| | | | |
|---|---|---|---|
| 2,194,551 | 3/1940 | Holman | 204—16 |
| 2,529,086 | 11/1950 | Law | 204—11 |
| 3,190,778 | 6/1965 | Dahlberg | 204—11 |
| 3,342,706 | 9/1967 | Liben et al. | 204—11 |

HOWARD S. WILLIAMS, *Primary Examiner.*

T. TUFARIELLO, *Assistant Examiner.*